United States Patent [19]

Barwick et al.

[11] Patent Number: 4,798,923

[45] Date of Patent: Jan. 17, 1989

[54] LATCH/SWITCH FOR SECURING A CIRCUIT MODULES INTO A HOUSING WITH ACCOMPANYING CIRCUIT SWITCHING

[75] Inventors: Morris L. Barwick, Denville; Ronald B. Praught, Freehold, both of N.J.

[73] Assignee: American Telephone and Telegraph Company, AT&T Bell Laboratories, Murray Hill, N.J.

[21] Appl. No.: 112,319

[22] Filed: Oct. 22, 1987

[51] Int. Cl.[4] ............................................. H01H 9/20
[52] U.S. Cl. ................................. 200/50 R; 200/1 B; 361/399
[58] Field of Search ............... 200/50 R, 61.59, 61.62, 200/61.69, 1 B; 361/399, 415

[56] References Cited

U.S. PATENT DOCUMENTS

| | | | |
|---|---|---|---|
| 1,895,820 | 1/1933 | Reeves | 200/1 B |
| 2,688,716 | 7/1954 | Eging | 361/340 |
| 3,052,820 | 9/1962 | Kreekon et al. | 361/340 |
| 4,536,822 | 8/1985 | Osborne | 361/340 |
| 4,596,907 | 6/1986 | LaGreco | 200/50 R |

*Primary Examiner*—A. D. Pellinen
*Assistant Examiner*—Morris Ginsburg
*Attorney, Agent, or Firm*—Alfred G. Steinmetz

[57] ABSTRACT

A latch/switch mechanism is attached to and operative for inserting and securing circuit modules into a housing while at the same time creating differing electrical connections during the insertion process. The latch/switch mechanism includes a latch lever with a cam and also included means to engage a support housing such as a notch or clip in the lever. The cam portion sequentially engages a plurality of conductive leaf springs and as the lever is rotated, the cam forces the making and breaking of certain connections of the conductive leaf springs to effect the various desired circuit connections and disconnections.

11 Claims, 2 Drawing Sheets

LATCH/SWITCH FOR SECURING A CIRCUIT MODULES INTO A HOUSING WITH ACCOMPANYING CIRCUIT SWITCHING

FIELD OF THE INVENTION

This invention relates to latch/switch mechanisms for inserting and securing circuit modules into an apparatus support housing and for sequentially enabling and disabling electrical connections during inserting and securing the circuit module into the housing.

BACKGROUND OF THE INVENTION

It is desirable to combine a switching arrangement with a latching mechanism that connects and disconnects certain sub circuits as a circuit module is inserted into and locked or secured into a circuit panel support housing. A typical circuit module mounted arrangement for synchronizing or combining a latch and switch (i.e. latch/switch) operation involves a mechanical interaction between a toggle switch on a circuit module and a latch also mounted on the module. As the latch is actuated to secure the circuit module into a support housing, it engages the toggle switch and moves it to successive positions engaging first one then another selected electrical circuit on the module as it is locked into place in the support housing. When the circuit module is removed from the housing, the opening of the latch moves the engaged toggle switch to de-energize the circuit module as it is removed so that no electrical hazard condition occurs as the circuit module is disengaged from the backplane.

A disadvantage of this arrangement is the fragility of the toggle switch making it readily susceptible to damage during assembly and soldering of the circuit module. A further problem with the above arrangement is the required preciseness of the mechanical interconnection between the latch and toggle switch. The difficulty of matching latch positions with toggle switch positions, especially with a three position toggle switch, necessitates strict dimensional tolerances during manufacture adding considerably to the overall cost of the latch/switch mechanism. This latch/switch arrangement is furthermore readily susceptible to mechanical failure in actual field operation, wherein damage may cause the latch/switch arrangement to partially fail and accordingly fail to de-energize a circuit as expected thereby causing a dangerous electrical hazard. It may, on the other hand, allow electrical power to be applied prematurely to the circuit module resulting in damage to electrical components contained thereon.

It is apparent from the foregoing that a suitable latch/switch arrangement must be readily manufacturable without undue narrow tolerance requirements if it is to be economically viable. It must also be mechanically reliable in providing the necessary sequential circuit connections during insertion and removal operations to minimize electrical hazards and protect circuit components.

SUMMARY OF THE INVENTION

A latch/switch mechanism embodying the principles of the invention is attached to and operative for inserting and securing circuit modules into a housing while at the same time creating differing electrical connections during the insertion process. The latch/switch mechanism includes a latch lever with a cam and also includes means to engage a support housing element such as a notch or clip in the lever. The cam portion engages one of a plurality of conductive leaf springs and as the lever is rotated, the cam forces the making and breaking of certain connections of between the various conductive leaf springs to effect the various desired circuit connections and disconnections.

DETAILED DESCRIPTION

Figure 1:
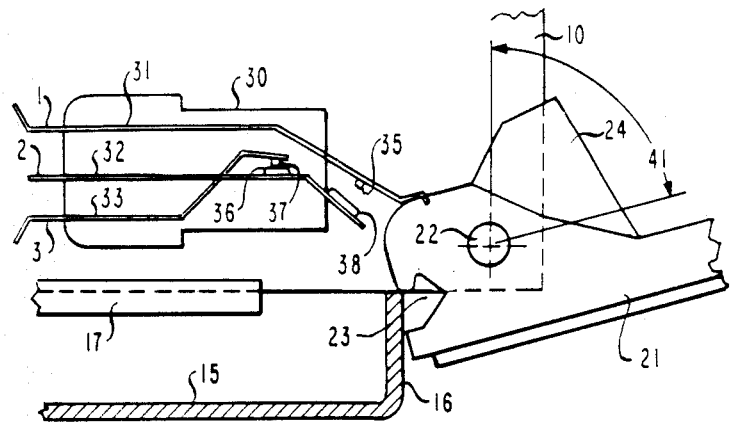
FIGS. 1, 2 and 3 are a schematic of the various operative positions of a latch/switch arrangement embodying the principles of the invention.
Figure 2:
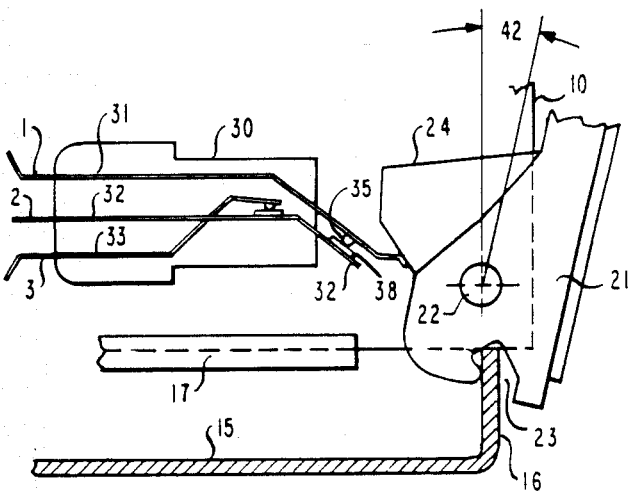
Figure 3:
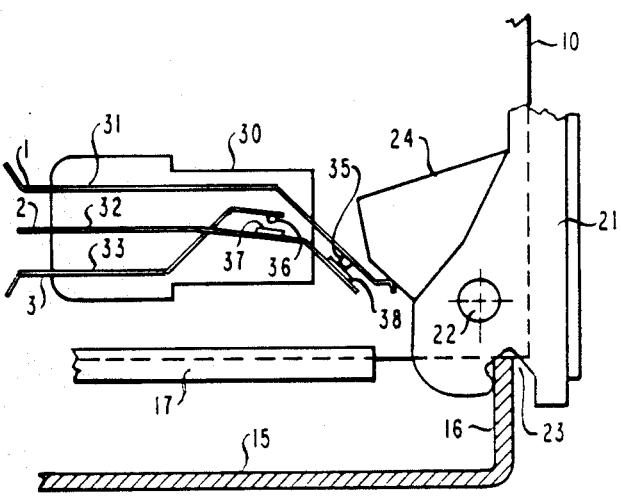

A latch/switch arrangement embodying the principles of the invention is shown in each of three distinct operational states or stages in FIGS. 1, 2 and 3 respectively. The first state is illustrated in FIG. 1 wherein a circuit module or panel 10, containing electrical circuits connected to conductors 1, 2 and 3 and a latch/switch arrangement is partially inserted into an apparatus support housing 15. In this stage of operation the panel back end (not shown) has not yet engaged the back plane electrical connectors of the apparatus support housing. The circuit panel 10 (shown in a fragment form) is assumed to contain various electrical circuits connected to conductors 1, 2 and 3 and that initially there exists a first circuit connection that is to be established for a finite duration during locking the circuit panel into the housing and at least a second circuit connection that is to be established for a finite duration during the insertion process and then changed or disconnected when the circuit panel is fully locked into the apparatus support housing 15 (as shown sequentially in FIGS. 1, 2, and 3).

As shown in the schematic diagram in FIG. 1 a circuit panel 10 has been initially inserted into an appartus support housing 15 which may include tracks or channels 17 to hold the panel edges and guide it into an aligned electrical connector at a back plane.

The latch portion of the arrangement (shown in fragment form) includes a lever 21 which is pivoted around a supporting axis 22 and is displaced at a first arc distance 41 from the vertical. When rotated to the vertical it eventually secures the circuit panel 10 into the apparatus support housing 15. One end of the lever 21 includes a notch 23 which is positioned to engage a lip member 16 of the apparatus support housing 15. Associated with the lever 21 is a conductive leaf spring contact arrangement 30 having three conductive leaf springs 31, 32 and 33. The conductive leaf spring 31 is flexible and is positioned to be engaged directly by a cam element 24 of the lever 21. A second conductive leaf spring 32 is also flexible and is positioned to be transitively flexed when leaf spring 31 is sufficiently flexed. A third conductive and flexible leaf spring 33, is positioned to normally engage the conductive leaf spring 32 with a minor interference bias (i.e., slight connecting pressure) prior to insertion of the circuit panel 10. This is to assure a good conductive connection between leaf springs 32 and 33 and a finite duration of connection. This minor interference assures good conductivity and finite duration connections during the entire operational range described below. Contact nodes designated 35, 36, 37 and 38 are included on different ones of the conductive leaf springs to facilitate designated electrical connections between the varoius conductive leaf springs. Each leaf spring is preferable electrically conductive and is conductively connected to a separate circuit path 1, 2 or 3 on the circuit panel 10.

As shown in FIG. 1, prior to the panel being engaged and locked into housing 10, the cam element 24 of the lever 21 has not yet engaged the conductive leaf spring 31 and the contact nodes 36 and 37 are in contact with each other electrically connecting the two conductive leaf springs 32 and 33. This contact is enhanced by the minor interference bias discussed above. The contact nodes 35 and 38 are disengaged from each other, and hence conductive leaf spring 31 is not electrically connected to any of the others. During this initial state, there is the slight flexural interference between leaf springs 32 and 33 resulting in contact pressure between contact nodes 36 and 37 for a finite arc of rotation of lever 21. Leaf spring 31 is in its relaxed position and will remain so until the cam element 24 of the lever 21 engages it.

The next stage of the insertion process, shown in FIG. 2 represents a stage when the lever 21 has rotated to a second arc distance 42 and the notch 23 has engaged the lip 16 and the back end of the panel is beginning to engage connectors in the back plane of the apparatus housing. Rotation of the lever 21 about the supporting axis 22 applies a force to the panel 10 at supporting axis 22 enabling it to begin to fully engage the electrical contacts of the back plane (not shown). At this particular stage, the cam element 24 has engaged conductive leaf spring 31 and displaced it sufficiently so that the two contact nodes 35 and 38 are electrically connected, thereby, electrically connecting the conductive leaf springs 31 and 32. The contact nodes 36 and 37 continue to remain in contact as they did in FIG. 1 for a finite arc of rotation of the lever 21 and its cam element 24. This finite duration of contact is controlled by and due to the minor interference bias discussed above. During this stage which extends over a predetermined finite arc of lever movement, the conductive leaf spring 31 is electrically connected to conductive leaf spring 32 and conductive leaf spring 32 is also electrically connected to conductive leaf spring 33.

In the final stage of the insertion process depicted in FIG. 3, the lever 21 has been moved into its locked position wherein it locks the panel securely into the housing 15 and has contacts at the back end of the panel fully engage the electrical contacts in the back plane. The cam element 24 has fully depressed the conductive leaf spring contact 31 which in turn has fully depressed the conductive leaf spring 32 via the force contact between contact nodes 35 and 38. As a result the contact nodes 35 and 38 remain in contact with each other and the contact nodes 36 and 37 have separated from each other and the conductive leaf springs 32 and 33 are no longer electrically connected with each other.

Figure 4:
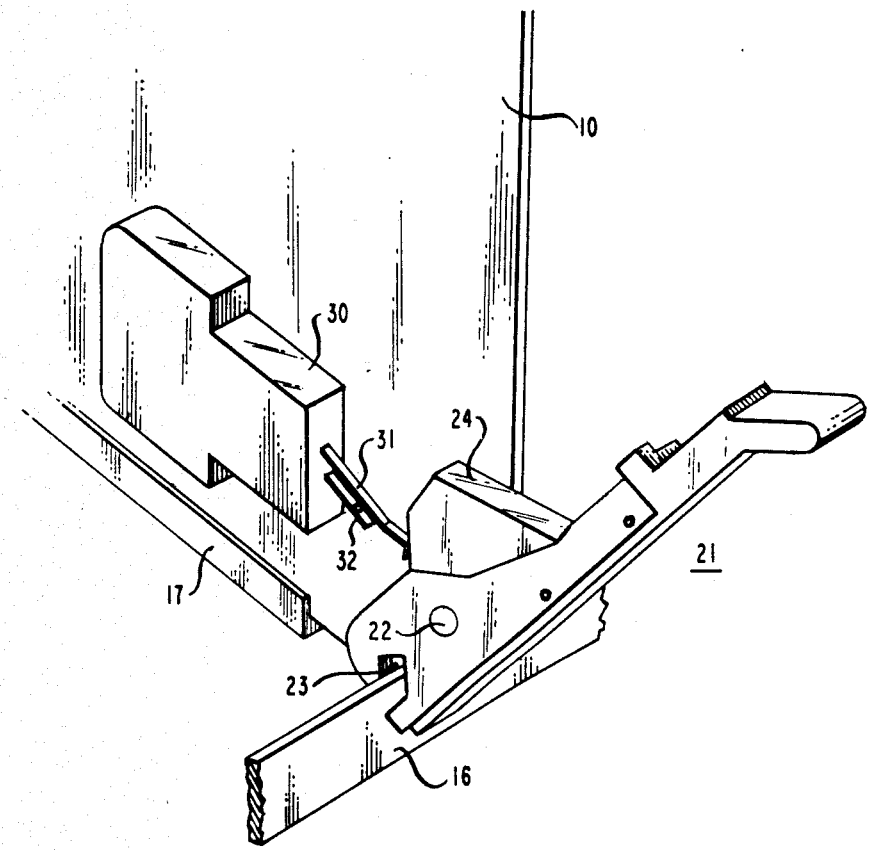
FIG. 4 is a perspective view of the latch/switch arrangement of FIGS. 1, 2 and 3 mounted on a module or panel partially inserted into a support housing.

A perspective view of the latch/switch arrangement is shown in FIG. 4 where the lever 21 is shown in its open position prior to the locking process to secure the panel into an appartus support housing. The supporting apparatus support housing includes a front structural member 16 which is a lip to which a notch 23 in the lever 21 is engaged in order to lock the panel 10 into the apparatus support housing. The panel itself fits into a channel member 17 which supports it and guides it into properly engaging the connectors in the back plane. The channel member 17 has a paired top channel member associated with it (not shown) to engage the top edge of the panel (not shown).

The conductive leaf spring contact arrangement 30 is mounted on the panel 10 and has its top conductive leaf spring 31 extended toward the lever 21 where it is positioned to be engaged by the cam element 24 of the lever. A second conductive leaf spring 32 below it is subsequently engaged when the top leaf spring 31 is sufficiently deflected. This deflection as described above enables the specified connections and disconnections of electrical circuit arrangements.

What is claimed is:

1. A circuit module including a latch/switch arrangement for inserting and securing the circuit module into an apparatus housing, comprising:
    a latch pivotably mounted on the circuit module for inserting and securing the circuit module into the apparatus housing,
    a switching arrangement mounted on the circuit module including first, second, and third conductive leaf springs;
    the latch including a cam surface to engage and apply pressure to displace the first conductive leaf spring from a rest position, when the latch is rotated to secure the circuit module into the housing,
    the second and third conductive leaf springs being situated to be conductively connected in an absence of displacement of the second conductive leaf spring,
    the cam surface initially flexing the first conductive leaf spring as the latch is rotated causing the first and second conductive leaf springs to be conductively joined,
    further rotation of the latch causing the cam surface to displace the first conductive leaf spring sufficiently to flex the second leaf spring causing it to disengage from the third conductive leaf spring.

2. A circuit module including a latch/switch arrangement as claimed in claim 1 wherein the third conductive leaf spring includes an interference flexural bias with the second conductive leaf spring so that the second and third conductive leaf springs are conductively connected for a finite arc of rotation of the latch.

3. A circuit module including a latch/switch arrangement as claimed in claim 1 wherein the first conductive leaf spring includes a first conductive node and the second conductive leaf spring includes a second conductive node positioned to be contacted by the first conductive node when the first conductive leaf spring is sufficiently displaced from its rest position.

4. A circuit module including a latch/switch arrangement as claimed in claim 3 wherein the third conductive leaf spring includes a third conductive node and the second conductive leaf spring includes a fourth conductive node normally contacting the third conductive node until the second conductive leaf spring is sufficiently displaced.

5. A circuit module including a combination latch and switch arrangement operative for inserting and securing a circuit module into an apparatus housing and enabling and disabling an electrical circuit connection during insertion and securing of the circuit module into the apparatus housing, the combination comprising:
    a lever including a means for inserting and securing the circuit module into the apparatus housing,
    a pivotal mounting for securing the lever to the circuit module and permitting the lever to rotate around the pivotal mounting, a switching mechanism operative for establishing first, second, and third circuit connections comprising, a base member affixed to the circuit module, a first leaf spring mounted on the base member, a second leaf spring mounted on the base member, a third leaf spring mounted on the base member, a cam attached to the lever and operative to engage the first leaf spring as the lever is rotated about is pivotal mounting, the first and second leaf springs being normally disengaged, the first leaf spring positioned to engage the second leaf spring in response to the cam as the lever is rotated over, a first angular displacement arc, the third leaf spring positioned to normally engage the second leaf spring, the third leaf spring disengaging from the second leaf spring when the lever is rotated over a second angular displacement arc greater in angular extent than the first angular displacement arc with the first leaf spring remaining engaged with the second leaf spring.

6. A circuit module including a combination latch and switch arrangement as claimed in claim 5 wherein the second and third leaf spring have a flexible interference whereby the second and third leaf spring remain engaged with each other for a finite arc of rotation of the lever after the first and second leaf springs have engaged each other.

7. A circuit module including a combination latch and switch arrangement as claimed in claim 5 wherein the means for inserting and securing includes a notch in the lever positioned to engage a lip structure of the appartus housing.

8. A circuit module including a combination latch and switch arrangement as claimed in claim 5 wherein each of the leaf springs includes at least a contact node for facilitating electrical connections between the leaf springs.

9. A circuit module including a combination latch and switch arrangement operative for inserting and locking the circuit module into an apparatus support housing and enabling and disabling electrical circuit connections during inserting and locking the circuit module into the appartus housing, the combination comprising:

the latch and switch arrangement including a switching mechanism mounted on the circuit module and operative for enabling and disabling electrical circuit connections, the switching mechanism including first, second, and third conductive leaf strips each arranged to connect to electric circuit paths on the circuit module, the first and second conductive leaf strips being flexible and being normally disengaged from one another, the third conductive leaf strip having a flexural bias so as to be engaged with the second conductive leaf strip, the latch and switch arrangement further including a lever pivotally mounted on the circuit module and including a means for locking the circuit module into the appartus housing as the lever is rotated about its pivotal mounting and including a cam positioned to engage the first conductive leaf strip as the lever is rotated in securing the circuit module into the appartus housing, and as the lever continues to rotate past a first arc distance, the first conductive leaf strip engaging the second conductive leaf strip and as the lever rotates past a second arc distance greater than the first arc distance the third conductive leaf strip disengaging from the second conductive leaf strip.

10. A circuit module including a combination latch and switch arrangement as claimed in claim 9 wherein each of the conductive leaf strips includes at least one conductive node aligned with a conducting node included on a nearby conductive leaf strip.

11. A circuit module including a combination latch and switch arrangement as claimed in claim 9 wherein the means for locking includes a notch in the lever positioned to engage a lip structure of the apparatus housing.

* * * * *